(12) United States Patent
Gebhart et al.

(10) Patent No.: US 7,264,680 B2
(45) Date of Patent: *Sep. 4, 2007

(54) PROCESS AND APPARATUS FOR TREATING A WORKPIECE USING OZONE

(75) Inventors: Thomas Maximilia Gebhart, Uffing (DE); Eric J. Bergman, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/859,668

(22) Filed: Jun. 3, 2004

(65) Prior Publication Data

US 2004/0216763 A1  Nov. 4, 2004

Related U.S. Application Data

(63) Continuation-in-part of application No. 09/621,028, filed as application No. PCT/US99/08516 on Apr. 16, 1999, now Pat. No. 6,869,487, which is a continuation-in-part of application No. 09/061,318, filed on Apr. 16, 1998, now abandoned, and a continuation-in-part of application No. 08/853,649, filed on May 9, 1997, now Pat. No. 6,240,933.

(51) Int. Cl.
*B08B 5/00* (2006.01)

(52) U.S. Cl. ............ 134/31; 134/2; 134/25.4; 134/30; 134/32; 134/34; 134/42; 438/906

(58) Field of Classification Search ........ 134/2, 134/3, 19, 26, 28, 30, 33, 34, 36, 37, 25.4, 134/31, 32, 42; 438/906

See application file for complete search history.

(56) References Cited

U.S. PATENT DOCUMENTS

| | | |
|---|---|---|
| 4,186,032 A | 1/1980 | Ham |
| 4,749,440 A | 6/1988 | Blackwood et al. |
| 4,817,652 A | 4/1989 | Liu |
| 4,917,123 A | 4/1990 | McConnell et al. |
| 4,974,530 A | 12/1990 | Lyon |
| 5,032,218 A | 7/1991 | Dobson |
| 5,055,138 A | 10/1991 | Slinn |
| 5,063,609 A | 11/1991 | Lorimer |
| 5,071,485 A | 12/1991 | Matthews et al. |

(Continued)

FOREIGN PATENT DOCUMENTS

EP         0 344 764         12/1989

(Continued)

*Primary Examiner*—M. Kornakov
(74) *Attorney, Agent, or Firm*—Perkins Coie LLP

(57) ABSTRACT

A method for cleaning a semiconductor workpiece having a metal layer in a processing chamber includes the steps of introducing a liquid solution including dissolved carbon dioxide onto the workpiece, and introducing ozone into the processing chamber. The ozone oxidizes contaminants on the workpiece, while the carbon dioxide inhibits corrosion of the metal layer. The liquid solution is preferably heated to a temperature greater than 40° C., and preferably comprises deionized water injected with carbon dioxide gas. The workpiece is preferably rotated within the processing chamber during the cleaning process. The ozone may be entrained in the liquid solution before the liquid solution is introduced onto the workpiece, or the ozone may be introduced separately into the processing chamber.

13 Claims, 5 Drawing Sheets

U.S. PATENT DOCUMENTS

| | | |
|---|---|---|
| 5,105,556 A | 4/1992 | Kurokawa et al. |
| 5,120,370 A | 6/1992 | Mori et al. |
| 5,160,378 A | 11/1992 | Tuunanen |
| 5,181,985 A * | 1/1993 | Lampert et al. ............ 438/748 |
| 5,232,511 A | 8/1993 | Bergman |
| 5,232,870 A | 8/1993 | Ito et al. |
| 5,234,540 A | 8/1993 | Grant et al. |
| 5,235,995 A | 8/1993 | Bergman et al. |
| 5,244,000 A | 9/1993 | Stanford et al. |
| 5,246,526 A | 9/1993 | Yamaguchi et al. |
| 5,248,380 A | 9/1993 | Tanaka |
| 5,308,745 A | 5/1994 | Schwartzkopf |
| 5,326,406 A | 7/1994 | Kaneko et al. |
| 5,366,757 A | 11/1994 | Lin |
| 5,372,651 A | 12/1994 | Kodama |
| 5,378,317 A | 1/1995 | Kashiwase et al. |
| 5,415,191 A | 5/1995 | Mashimo et al. |
| 5,415,783 A * | 5/1995 | Johnson et al. ............ 210/699 |
| 5,447,640 A | 9/1995 | Omi |
| 5,464,480 A | 11/1995 | Matthews |
| 5,503,708 A | 4/1996 | Koizumi et al. |
| 5,520,744 A | 5/1996 | Fujikawa et al. |
| 5,567,244 A * | 10/1996 | Lee et al. .................. 134/3 |
| 5,571,367 A | 11/1996 | Nakajima et al. |
| 5,612,304 A * | 3/1997 | Honda et al. ............... 510/176 |
| 5,626,769 A | 5/1997 | Sawamoto |
| 5,632,847 A | 5/1997 | Ohno et al. |
| 5,647,386 A | 7/1997 | Kaiser |
| 5,658,615 A | 8/1997 | Hasebe et al. |
| 5,705,089 A | 1/1998 | Sugihara et al. |
| 5,706,842 A | 1/1998 | Caimi et al. |
| 5,714,203 A | 2/1998 | Schellenberger et al. |
| 5,730,806 A | 3/1998 | Caimi et al. |
| 5,749,975 A | 5/1998 | Li et al. |
| 5,759,971 A * | 6/1998 | Manako .................... 510/175 |
| 5,762,755 A | 6/1998 | McNeilly et al. |
| 5,776,296 A | 7/1998 | Matthews |
| 5,785,738 A * | 7/1998 | Gastiger et al. ............. 95/12 |
| 5,803,982 A | 9/1998 | Kosofsky et al. |
| 5,810,940 A | 9/1998 | Fukazawa |
| 5,832,177 A | 11/1998 | Shingawa |
| 5,845,662 A | 12/1998 | Sumnitsch |
| 5,858,107 A | 1/1999 | Chao et al. |
| 5,896,875 A | 4/1999 | Yoneda |
| 5,911,837 A | 6/1999 | Matthews |
| 5,916,366 A | 6/1999 | Ueyama et al. |
| 5,944,907 A | 8/1999 | Ohmi |
| 5,950,643 A | 9/1999 | Miyazaki et al. |
| 5,964,952 A | 10/1999 | Kunze-Concewitz |
| 5,964,954 A | 10/1999 | Matsukawa et al. |
| 5,971,368 A | 10/1999 | Nelson et al. |
| 6,030,932 A | 2/2000 | Leon et al. |
| 6,146,469 A | 11/2000 | Toshima |
| 6,240,933 B1 * | 6/2001 | Bergman .................... 134/1.3 |
| 6,249,933 B1 | 6/2001 | Berfield |
| 6,267,125 B1 | 7/2001 | Bergman et al. |
| 6,273,108 B1 | 8/2001 | Bergman et al. |
| 6,299,696 B2 | 10/2001 | Kamikawa et al. |
| 6,383,724 B1 * | 5/2002 | Carter et al. ................ 430/329 |
| 6,416,586 B1 * | 7/2002 | Ohmi et al. ................ 134/1 |
| 6,551,409 B1 * | 4/2003 | DeGendt et al. ............. 134/2 |
| 6,589,359 B2 | 7/2003 | Kamikawa et al. |
| 6,743,301 B2 * | 6/2004 | Matsuno et al. ............. 134/26 |
| 6,758,938 B1 | 7/2004 | Torek |
| 6,786,976 B1 * | 9/2004 | Gottschalk et al. .......... 134/10 |
| 6,982,006 B1 | 1/2006 | Boyers et al. |
| 2002/0011257 A1 | 1/2002 | DeGendt |

FOREIGN PATENT DOCUMENTS

| | | | |
|---|---|---|---|
| EP | 0 548 596 | * | 6/1993 |
| EP | 0 548 596 A2 | | 6/1993 |
| EP | 0 702 399 | | 3/1996 |
| EP | 0 782 177 A2 | | 7/1997 |
| JP | 52-012063 | | 4/1977 |
| JP | 52-100473 | | 8/1977 |
| JP | S61-004232 | | 1/1986 |
| JP | 62-117330 | | 5/1987 |
| JP | 63-016127 | | 1/1988 |
| JP | 63-110732 | | 5/1988 |
| JP | 64-008630 | | 1/1989 |
| JP | 64-042129 | | 2/1989 |
| JP | 1-114043 | * | 5/1989 |
| JP | 01-192712 | | 8/1989 |
| JP | H01-262627 | | 10/1989 |
| JP | 03-041729 | | 2/1991 |
| JP | 03-072626 | | 3/1991 |
| JP | H03-208900 | | 9/1991 |
| JP | H04-125927 | | 4/1992 |
| JP | 04-302144 | | 10/1992 |
| JP | 04-302145 | | 10/1992 |
| JP | H04-298038 | | 10/1992 |
| JP | 04-370931 | | 12/1992 |
| JP | 05-013398 | | 1/1993 |
| JP | 05-109686 | | 4/1993 |
| JP | 05-259139 | | 10/1993 |
| JP | 05-283389 | | 10/1993 |
| JP | 06-204130 | | 7/1994 |
| JP | 07-159980 | | 6/1995 |
| JP | 08-008222 | | 1/1996 |
| JP | EP0 703 187 | * | 3/1996 |
| JP | 08-160032 | | 6/1996 |
| JP | 2001-62412 | * | 3/2001 |
| JP | 2003-86559 | * | 3/2003 |
| WO | WO99/52654 | | 10/1999 |

* cited by examiner

US 7,264,680 B2

PROCESS AND APPARATUS FOR TREATING A WORKPIECE USING OZONE

This application is a Continuation-in-Part of U.S. patent application Ser. No. 09/621,028, filed Jul. 21, 2000, and now U.S. Pat. No. 6,869,487, which is the U.S. National Phase of International Application No. PCT/US99/08516, filed Apr. 16, 1999, (designating the United States and published in English), which is a Continuation-in-Part of Ser. No. 09/061,318, filed Apr. 16, 1998, now abandoned. This Application is also a Continuation-in-Part of: Ser. No. 08/853,649, filed May 9, 1997, now U.S. Pat. No. 6,240,933. Priority to each of these application is claimed. The above listed applications are also incorporated herein by reference.

BACKGROUND OF THE INVENTION

Semiconductor devices are widely used in almost all consumer and home electronic products, as well as in communications, medical, industrial, military, and office products and equipment. Microelectronic semiconductor devices are manufactured from semiconductor wafers. These devices are often just fractions of a micron. This makes these microelectronic devices highly susceptible to performance degradation or even complete failure due to contamination by organic or metal particles. Consequently, cleaning the wafers, to remove contamination, is often a critical step in the manufacturing process.

For many years, wafers were cleaned in typically three or four separate steps using strong acids, such as sulfuric acid, and using strong caustic solutions, such as mixtures of hydrogen peroxide or ammonium hydroxide. Organic solvents have also been used with wafers having metal films. While these methods performed well, they had certain disadvantages, including the high cost of the process chemicals, the relatively long time required to get wafers through the various cleaning steps, high consumption of water due to the need for extensive rinsing between chemical steps, and high disposal costs. As a result, extensive research and development efforts focused on finding better wafer cleaning techniques.

More recently, the semiconductor manufacturing industry began to acknowledge a revolutionary new process for cleaning wafers, using ozone diffused through a thin layer of heated water on the wafers. This ozone diffusion process has proven itself to be highly effective in cleaning contamination and organic films off of wafers, while avoiding many of the disadvantages of the older methods using acids and caustics. The advantages of the ozone diffusion process are that it is fast, requires no expensive and toxic liquid acids or caustics, and operates effectively as a spray process, which greatly reduces water consumption and space requirements.

The ozone diffusion cleaning technique can be performed in various ways. These include spraying water onto the workpiece while injecting ozone into the water, spraying water on the workpiece while delivering ozone to the workpiece, delivering a combination of steam or water vapor and ozone to the workpiece, and applying water, ozone, and sonic energy simultaneously to the workpiece. Spray techniques using water at elevated temperatures have been especially successful at increasing the removal rates of various organic films and contaminants from workpiece surfaces.

Certain metals that are commonly used on semiconductor wafers can corrode when exposed to ozone and heated water. As the process temperatures increase, the chemical reaction rate of all reactions, including metal corrosion, also increases. Dissimilar metals in ohmic contact with each other can also create a galvanic cell potential or electrical interaction which may promote corrosion.

Several methods have been developed to reduce or avoid corrosion. These methods typically include reducing the process temperature and/or using additives that include various corrosion inhibitors. Reducing the temperature is generally undesirable because it slows down the reaction rates of the chemicals acting to remove the organic films or contaminants from the workpiece. Corrosion inhibitors, which generally include additives such as nitrates, silicates, and benzo triazole, have been relatively effective at reducing corrosion on predominantly aluminum films. The application of these inhibitors with the ozone cleaning techniques has allowed use of higher process temperatures, to achieve higher cleaning or strip rates, while substantially controlling corrosion of aluminum surfaces on the wafers.

Still, use of corrosion inhibitors in cleaning semiconductor wafers can be disadvantageous as it involves using an additional chemical or additive, the corrosion inhibitors must be appropriately mixed with the process liquid, and their effectiveness can vary with different metals and other process parameters. Accordingly, there is still a need for a methods for efficiently cleaning a semiconductor wafers using the diffused ozone techniques, while also preventing corrosion of metals, such as copper and aluminum, on the wafers.

SUMMARY OF THE INVENTION

New methods have now been invented for cleaning, stripping or processing wafers having metal features or surfaces. With these new methods, corrosion of metals is dramatically reduced, or entirely eliminated, while keeping the advantages of the new ozone diffusion process. These new methods use carbon dioxide, which is readily available, inexpensive, and non-toxic. Corrosion inhibitors, and strong acids or caustics, are not needed and are not used. Accordingly, these new methods are both economical and environmentally friendly.

In a first aspect, a method for cleaning a wafer or article having a metal area, feature or layer includes the steps of placing the article into a processing chamber, introducing a liquid solution including carbon dioxide onto the article, and introducing ozone into the processing chamber. The ozone oxidizes contaminants or organic coatings on the article. The carbon dioxide inhibits corrosion of the metal. The method may be performed at sub-ambient temperatures (for example 0-20° C.), at ambient temperatures (near 20° C.), or at higher temperatures.

In additional aspects, the liquid solution is heated to a temperature above 20° C., such as 21, 25 or 26-99° C.; or 21, 25 or 26-65° C. Temperatures of 100° C. or higher may also be used with boiling avoided by pressurization or liquid solutions with higher boiling temperatures. The liquid solution in general includes de-ionized water, with the carbon dioxide gas injected or entrained into or dissolved into the liquid solution. The liquid solution, with or without carbon dioxide, and the ozone, may be introduced or sprayed separately, or together, into the processing chamber. The ozone may be provided into the processing chamber separately, as a dry gas. Alternatively, the ozone, with or without the $CO_2$, may be injected, or entrained and/or dissolved in one or more flows of liquid provided into the chamber. The wafers or articles may be held stationery, or they may be rotated. For some applications, the liquid solution may optionally be converted to steam before being introduced into the processing chamber.

The invention resides as well in subcombinations of the features, components, steps, and subsystems shown and described. The optional steps described in one embodiment or shown in one drawing may apply equally to any other embodiment or drawing.

BRIEF DESCRIPTION OF THE DRAWINGS

In the drawings, wherein the same reference number indicates the same element throughout the several views.

While showing preferred designs, the drawings include elements which may or may not be essential to the invention. The elements essential to the invention are set forth in the claims. Thus, the drawings include both essential and nonessential elements.

DETAILED DESCRIPTION OF THE DRAWINGS

A workpiece, or microelectronic workpiece, is defined here to include a workpiece formed from a substrate upon which microelectronic circuits or components, data storage elements or layers, and/or micro-mechanical elements are formed. The apparatus and methods described here may be used to clean or process workpieces such as semiconductor wafers or articles, as well as other workpieces or objects such as flat panel displays, hard disk media, CD glass, memory media, optical media or masks, etc.

Although the apparatus is illustrated for use in single wafer processing, the apparatus and methods of FIGS. 1-5 may also be used on a batch of workpieces. Thus, all references to a single workpiece 20 are directed to multiple workpieces as well.

Figure 1:
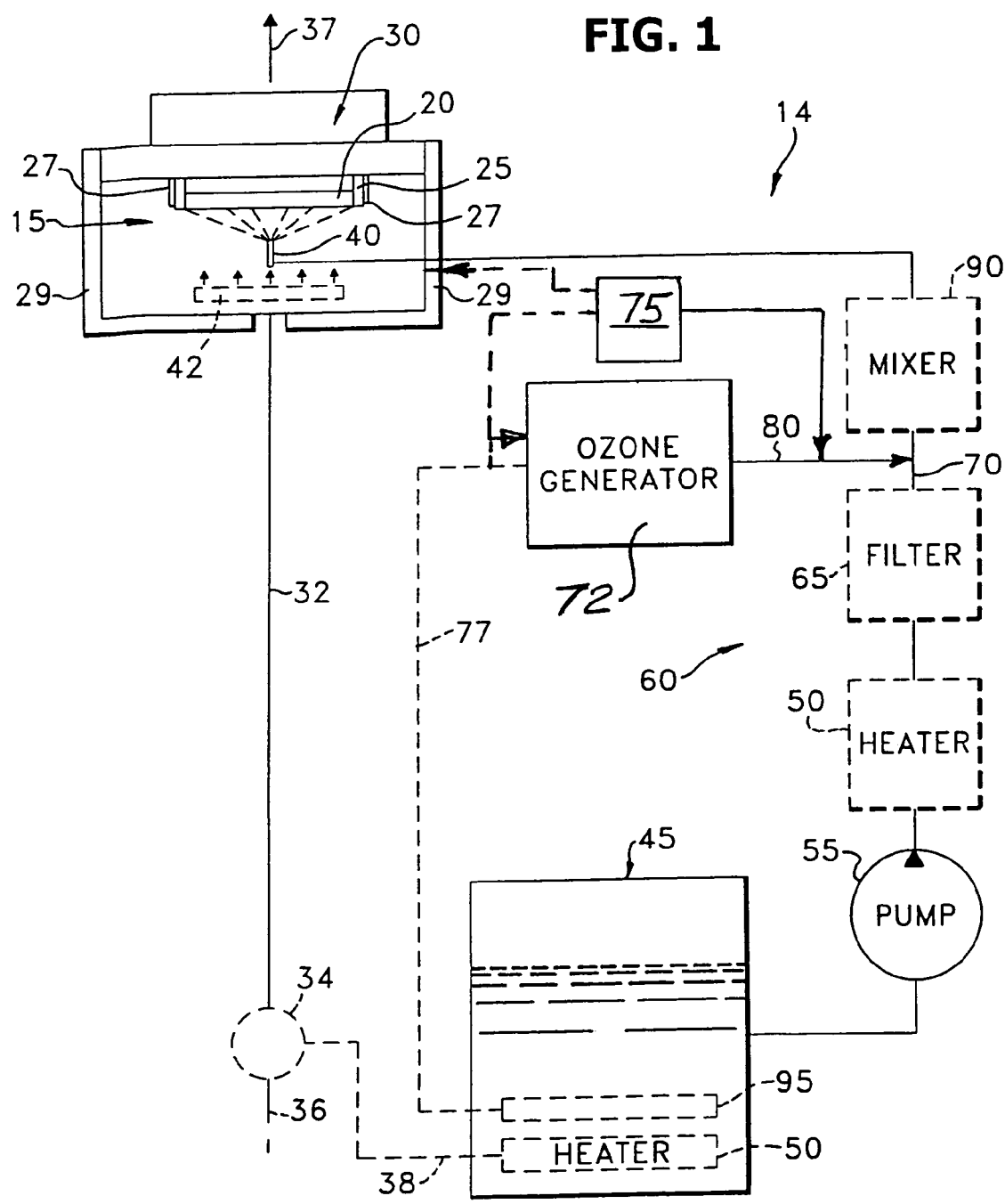
FIG. 1 is a schematic diagram of an apparatus for cleaning or processing a workpiece, such as a semiconductor wafer, with ozone injected or bubbled into the liquid.

Turning now to FIG. 1, in a processing or cleaning system 14, a workpiece 20 is preferably supported within a processing chamber 15 by one or more supports 25 extending from, for example, a rotor assembly 30. A chamber door closes off or seals the chamber 15. The rotor assembly 30 spins the workpiece 20 about a spin axis 37 during and/or after processing with ozone, $CO_2$ and a process liquid. The spin axis 37 is preferably vertical, although it may alternatively have other orientations. Alternatively, a stationary fixture may be used in the chamber 15 for non-spinning methods.

The volume of the processing chamber 15 is preferably minimized. The processing chamber 15 is preferably cylindrical for processing multiple workpieces or wafers in a batch. A flatter disk-shaped chamber is advantageously used for single wafer processing. Typically, the chamber volume will range from about 5 liters (for a single wafer) to about 50 liters (for a 50 wafer system).

One or more nozzles 40 are preferably disposed within the processing chamber 15 to direct a spray mixture of ozone and liquid onto the surfaces of the workpiece 20. The nozzles 40 preferably direct a spray of liquid to the underside of the workpiece 20. However, the spray may alternatively or additionally be directed to the upper surface of the workpiece 20. The liquid may also be applied in other ways besides spraying, such as flowing, bulk deposition, immersion, condensation, etc.

Process liquid, $CO_2$, and ozone may be supplied to the nozzles 40 by a fluid line carrying the gases mixed with the liquid. A reservoir 45 or tank preferably holds the liquid. The reservoir 45 is preferably connected to the input of a pump 55. The pump 55 provides the liquid under pressure along a fluid flow path 60, for supply to the nozzles 40. While use of a reservoir 45 is preferred, any liquid source may be used, including a pipeline.

One or more heaters 50 in the liquid flow path may be used to heat the process liquid. An in-line heater, or a tank heater, or both, may be used, as shown in FIG. 1. For sub-ambient applications, the heaters are replaced with chillers. For processes at ambient or room temperatures, the heater 50 can be omitted. The liquid flow path 60 may optionally include a filter 65 to filter out microscopic contaminants from the process liquid. The process liquid, still under pressure, is provided at the output of the filter 65 (if used) along fluid flow line 70.

In the embodiment illustrated in FIG. 1, ozone is injected into the flow line 70. The ozone is generated by an ozone generator 72 and is supplied along an ozone supply line 80, under at least nominal pressure, to the fluid flow line 70. The $CO_2$ is similarly supplied from a $CO_2$ source, such as a bottle. Optionally, the liquid, now injected with ozone and $CO_2$, is supplied to the input of a mixer 90 that mixes the ozone, $CO_2$, and the process liquid. The mixer 90 may be static or active. From the mixer 90, the process liquid carrying the ozone and $CO_2$ is provided to the input of nozzles 40. The nozzles 40 spray the liquid onto the surface of the workpiece 20 to be treated, and also introduce the ozone and $CO_2$ into the environment of the processing chamber 15. As an alternative to mixing, the ozone and/or $CO_2$ may be entrained in the liquid before the liquid is sprayed onto the workpiece 20. The mixer 90 may be omitted.

To further concentrate the ozone and/or $CO_2$ in the process liquid, an output line 77 of the ozone generator 72 and $CO_2$ source may supply ozone and/or $CO_2$ to a dispersion unit 95 in the reservoir 45. The dispersion unit 95 provides a dispersed flow of ozone and/or $CO_2$ through the process liquid before injection of the gas into the fluid path 60. The dispersion unit 95 may also be omitted.

In the embodiment illustrated in FIG. 1, used liquid in the processing chamber 15 is optionally collected and drained via a fluid line 32 to, for example, a valve 34. The valve 34 may be operated to provide the spent liquid to either a drain outlet 36 or back to the reservoir 45 via a recycle line 38. Repeated cycling of the process liquid through the system and back to the reservoir 45 assists in elevating the ozone and/or $CO_2$ concentration in the liquid through repeated injection and/or dispersion. The spent liquid may alternatively be directed from the processing chamber 15 to a waste drain. The workpieces may also be heated directly, via optional heating elements 27, or via a chamber heater 29 for heating the chamber and indirectly heating the workpiece 20.

Figure 2:
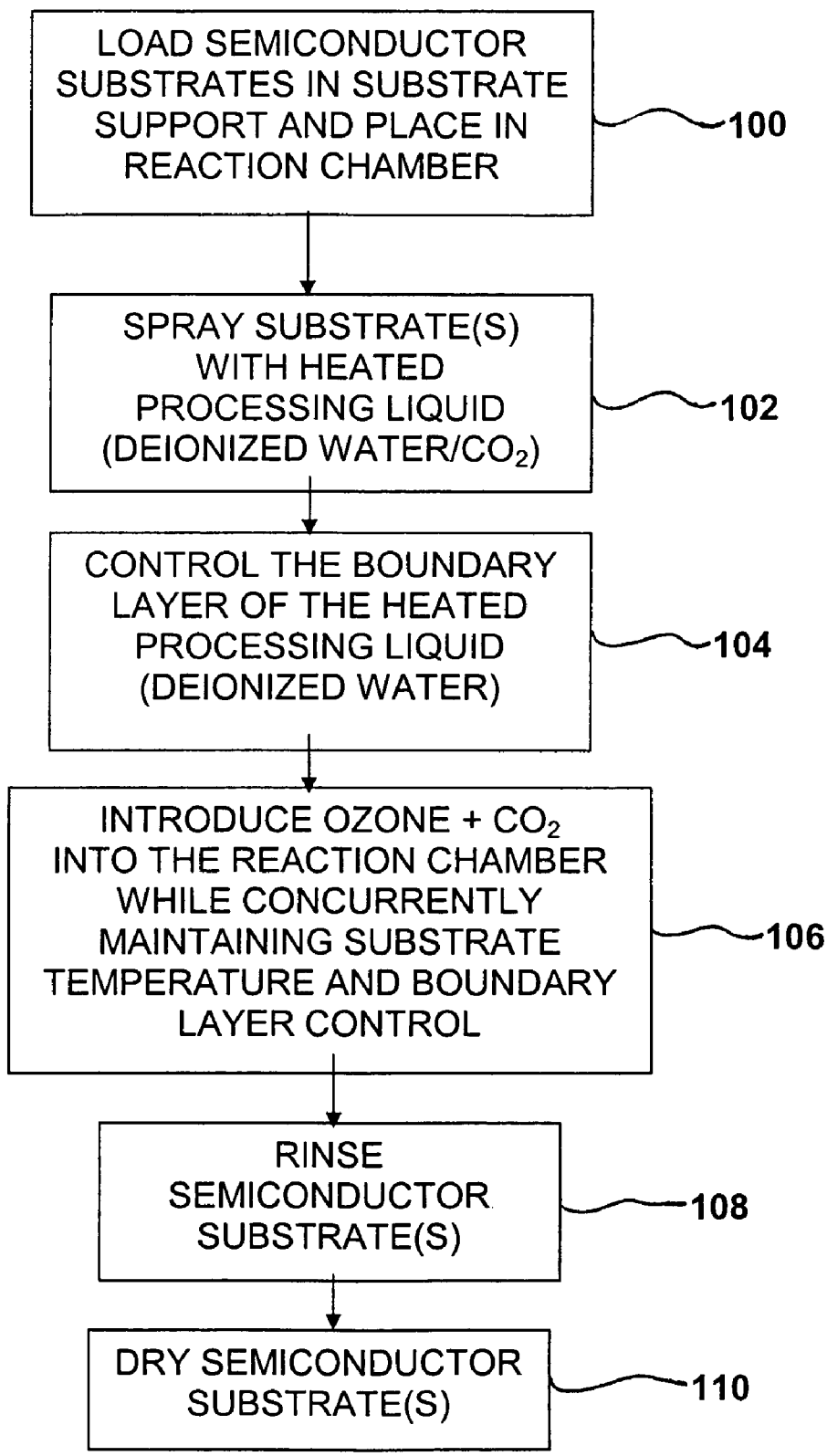
FIG. 2 is a flow diagram illustrating steps for process for cleaning or processing a workpiece using a liquid and ozone.

FIG. 2 illustrates a process that may be carried out in the system of FIG. 1, for example, to clean a workpiece having metal plated surfaces. At step 100, the workpiece 20 is placed in, for example, a holding fixture on the rotor assembly 30. For batch processing, a batch of workpieces 20 may be placed into a wafer cassette or other carrier, for processing in a stand alone processor, such as in Ser. No. 10/654,859, or in an automated system, for example, as described in U.S. Pat. Ser. Nos. 6,447,232; or 5,660,517, and Ser. No. 09/612,009, all incorporated herein by reference. Alternatively, the workpieces 20 may be disposed in the processing chamber 15 in a carrierless manner, using an automated processing system, such as that described in U.S. Pat. Nos. 5,784,797 or 6,279,724, both incorporated herein by reference.

The holding fixture or cassette, if used, is placed in a closed environment, such as in the processing chamber 15. At step 102, heated deionized water including $CO_2$ is sprayed onto the surfaces of the workpiece 20. The heated deionized water heats the workpiece 20. The $CO_2$ reduces or avoids corrosion of the metal surfaces on the workpiece. The boundary layer of deionized water (i.e. the thickness of the layer of water on the workpiece) is controlled at step 104 using one or more techniques. For example, the workpiece 20 may be rotated about axis 37 by the rotor 30 to generate centrifugal forces that thin the boundary layer. The flow rate of the deionized water may also be used to control the thickness of the surface boundary layer.

At step 106, ozone and $CO_2$ is injected into the fluid flow path 60 during the spray of water, or otherwise provided directly into the processing chamber 15. If the apparatus of FIG. 1 is used, the injection of the ozone preferably continues after the spray of water is shut off. If the workpiece surface begins to dry, a brief spray is preferably activated to replenish the liquid film on the workpiece surface.

Elevated temperature, or heated water or liquid here means temperatures above ambient or room temperature, that is temperatures above 20, 21, 25, 26, 30, 35 or 40° C. and up to about 200° C. Preferred temperature ranges are 21 or 26-99° C.; and 21 or 26-65° C. In the methods described, temperatures of 90-100° C., and preferably centering around 95° C., may be used. To avoid boiling at ambient pressures, temperature ranges of 21 or 26 to about 65° C. may be used.

After the workpiece 20 has been processed via the reactions of the ozone and/or liquid, the workpiece 20 is optionally rinsed at step 108 and dried at step 110.

High ozone flow rates and concentrations can be used to produce higher strip rates under various processing conditions including lower wafer rotational speeds and reduced temperatures. Use of lower temperatures, for example sub-ambient temperatures ranging from 0, 5 or 10-20° C. , or near ambient temperatures, for example 15-25° C., or above ambient temperatures such as 20, 21, 25, or 26-65° C. may be advantageous when higher temperatures are undesirable. In some applications, even with use of carbon dioxide, the temperature of the liquid is advantageously limited, to avoid corrosion of metal surfaces in the presence of ozone.

With reference again to FIG. 2, the process steps 102-106 may be performed in a substantially concurrent manner. Process steps 102-106 may be sequentially repeated using different processing liquids. In such instances, each of the processing liquids that are used may be specifically prepared to remove a specific set of contaminants. Preferably, however, it is desirable to use as few different processing liquids as possible. By reducing the number of different processing liquids utilized, the overall cleaning process is simplified and chemical consumption is minimized.

Figure 3:
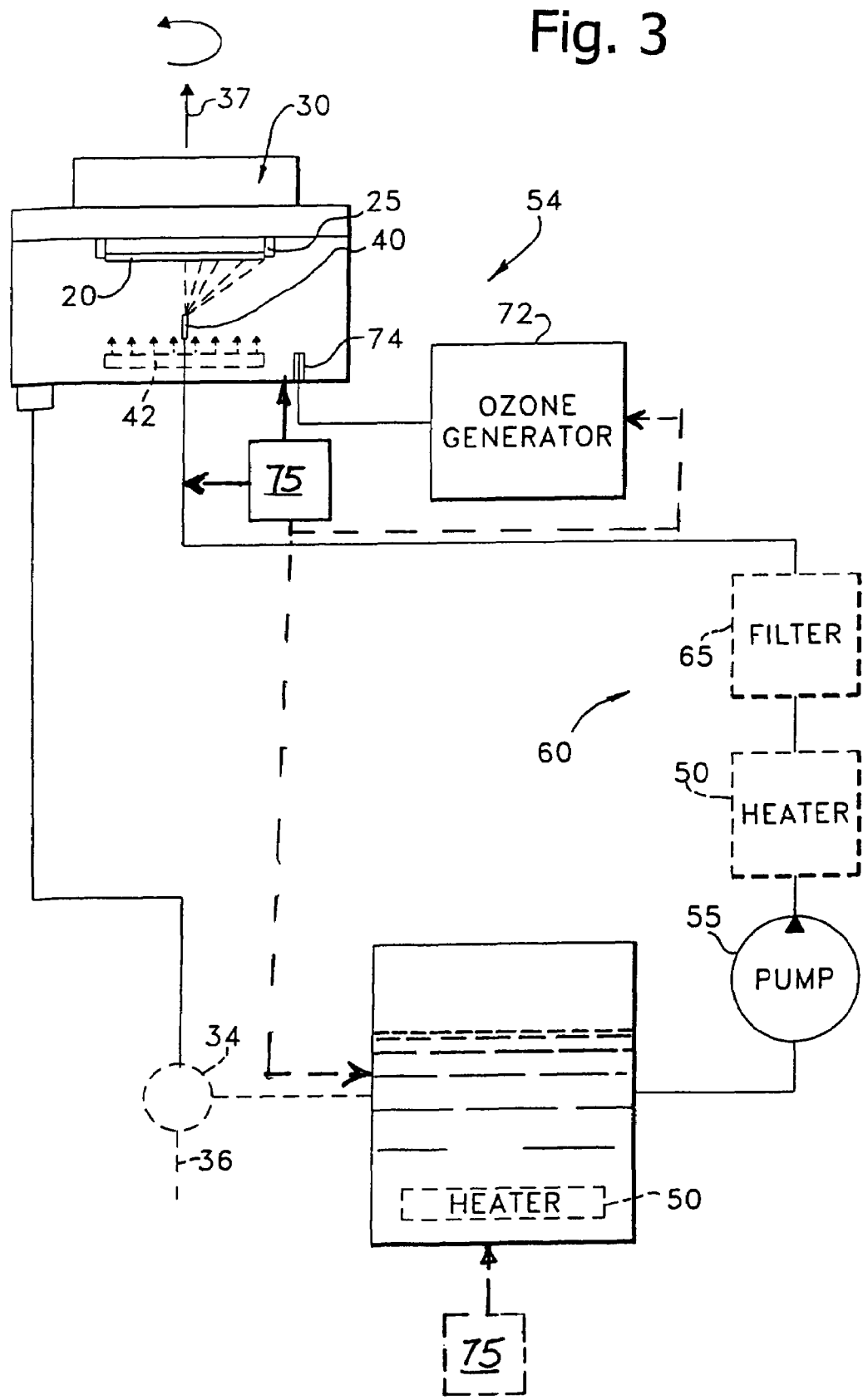
FIG. 3 is a schematic diagram of an apparatus for cleaning or processing a workpiece using ozone and a liquid, with the ozone supplied into the processing chamber, rather than into the liquid as shown in FIG. 1.

Turning to FIG. 3, in another ozone diffusion process system 54, one or more nozzles 74 or openings within the processing chamber 15 deliver ozone from ozone generator 72 directly into the reaction environment or chamber interior. Injection of ozone into the fluid path 60 is optional. As in FIG. 1, the $CO_2$ may be supplied directly into the chamber, into the ozone generator, into a fluid supply line, or into the reservoir, or a combination of them. The system of FIG. 3 is otherwise the same as the system of FIG. 1 described above.

Figure 4:
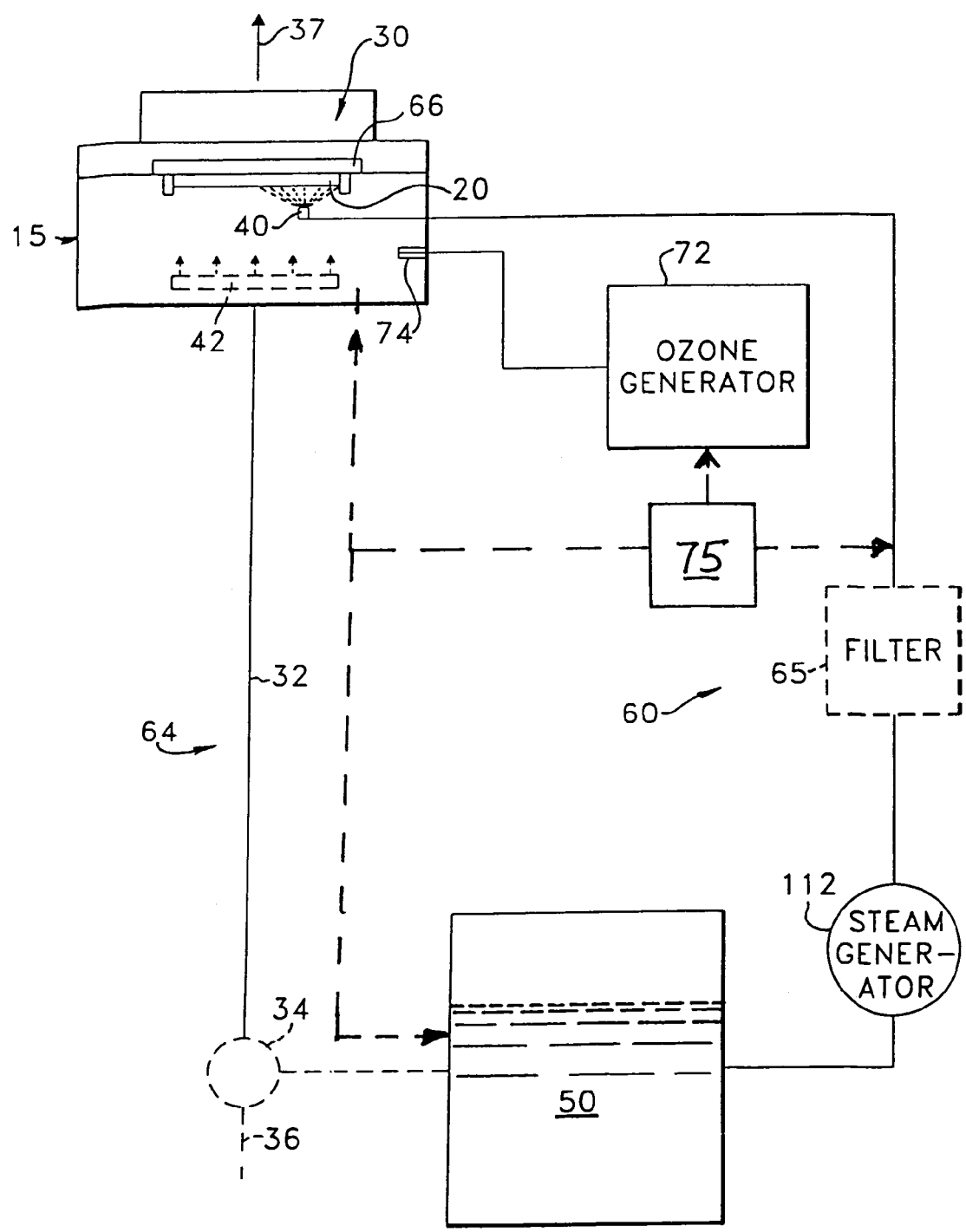
FIG. 4 is a schematic diagram of an apparatus for cleaning or processing a workpiece using steam and ozone.

Referring to FIG. 4, in another ozone diffusion process system 64, a steam boiler 112 supplies steam under pressure into the processing chamber 15. The reaction chamber 15 is preferably sealed to form a pressurized atmosphere around the workpiece 20. Ozone and/or $CO_2$ may be directly injected into the processing chamber 15 as shown, and/or may be injected into steam supply pipe. With this design, workpiece surface temperatures can exceed 100° C., further accelerating the reaction kinetics. $CO_2$ is delivered with the ozone or separately. While FIGS. 3 and 4 show the fluid and ozone delivered via separate nozzles 40, 74, they may also be delivered from the same nozzles, using appropriate valves. A temperature-controlled surface or plate 66, as shown in FIG. 4, is advantageously in contact with the workpiece, to act as a heat sink, to maintain condensation of steam on the workpiece. Alternatively, a temperature-controlled stream of liquid (e.g., at 75 or 85-95° C.) is delivered to the back surface of a wafer 20, while steam and ozone and $CO_2$ are delivered to the process chamber and the steam condenses on the wafer surface. The wafer may be rotated to promote uniform distribution of the boundary layer, as well as helping to define the thickness of the boundary layer through centrifugal force. Rotation, however, is not a requirement.

The workpiece may be in any orientation during processing. Additives such as hydrofluoric acid, HCl, or ammonium hydroxide, may be added to the system to promote the cleaning of the surface or the removal of specific classes of materials other than, or in addition to, organic materials. The supply of liquid, gases, and/or steam may be continuous or pulsed.

An ultra-violet or infrared lamp 42 is optionally used in any of the designs described above, to irradiate the surface of the workpiece 20 during processing, and enhance the reaction kinetics. Megasonic or ultrasonic nozzles may also be used.

Figure 5:
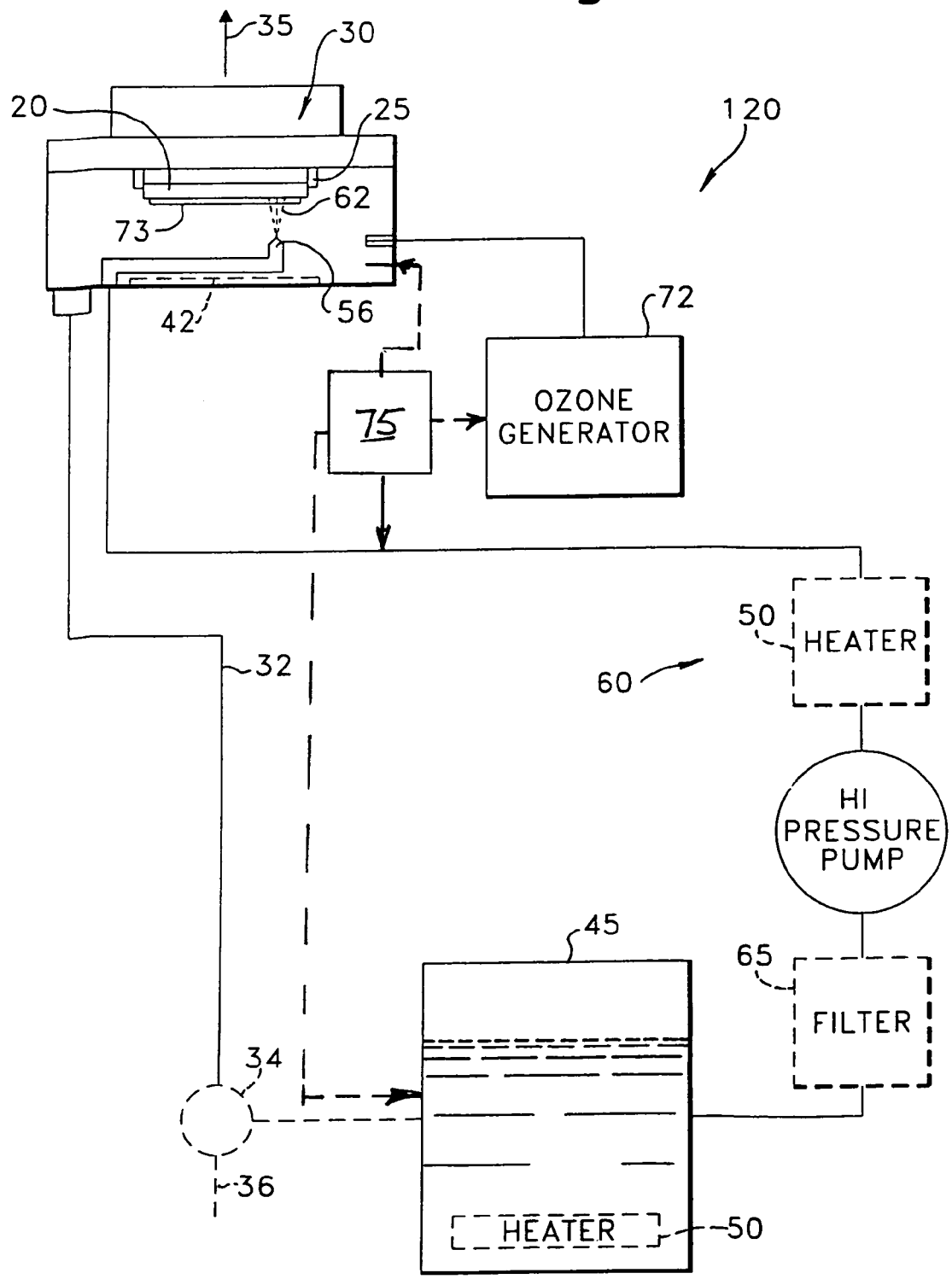
FIG. 5 is a schematic diagram of an apparatus similar to the apparatus of FIG. 3, wherein liquid is applied to the workpiece in the form of a high pressure jet.

Referring to FIG. 5, another alternative system 120 is similar to the system 54 shown in FIG. 3, except that the system 120 does not use the spray nozzles 40. Rather one or more jet nozzles 56 are used to form a high pressure jet 62 of liquid. The liquid formed into the high pressure jet 62 penetrates through the boundary layer 73 of liquid on the workpiece surface and impinges on the workpiece surface with much more kinetic energy than in conventional water spray processes. The increased kinetic energy of the jet physically dislodges and removes contaminants. Unlike conventional fluid spray systems, few, if any, droplets are formed. Rather, a concentrated jet or beam of liquid impacts on a small spot on the workpiece 20.

In the systems of FIGS. 1-5, a carbon dioxide ($CO_2$) supply line supplies $CO_2$ from a source 75 (such as a bottle), into the liquid delivery line(s), into the ozone generator; into the liquid in the reservoir, and/or into the processing chamber. The $CO_2$ can be dissolved and/or injected into the liquid. When mixed with water outside of the process chamber, $CO_2$ forms the weak acidic solution $H_2CO_3$, before being introduced into the processing chamber.

Additionally, the $CO_2$ may be introduced separately from, or in combined with, the ozone. For example, the $CO_2$ may be run through the ozone generator along with oxygen, and then be introduced into the processing chamber with the ozone. Alternatively, the ozone may be entrained in the liquid solution including the $CO_2$ before it is introduced into the processing chamber. The ozone may also be introduced separately into the processing chamber as a dry gas. The invention contemplates use of heated water, ozone, and $CO_2$, regardless of how each of these elements is provided into the chamber.

The use of $CO_2$ with ozone substantially reduces or eliminates corrosion of aluminum films, as well as other metal films, including copper, on the workpiece 20. Corrosion of metal layers typically occurs more readily when processing is performed at elevated temperatures, because elevated temperatures increase the reaction kinetics of the corrosive process. The use of $CO_2$ with ozone and water, however, allows for processing at higher temperatures without the risk of substantial corrosion, since the $CO_2$ works to inhibit corrosion of the metal layers. Accordingly, deionized water heated to at least 20, 21, 25, 26, or 30° C., may be used in the processing system 300. By processing at higher temperatures, the oxidizing rate of the ozone on the organic films, photoresist, and/or other contaminants on the workpiece surface is accelerated, which increases the removal rate of the organic films, photoresist, and contaminants.

The liquid solution including $CO_2$ may be sprayed onto the workpiece 20 via one or more nozzles 40. Alternatively, the workpiece 20 may be immersed in a solution containing $CO_2$, or the liquid solution may be converted to steam or vapor before being introduced into the processing chamber 15. The use of $CO_2$ is advantageous, as it is very low cost and is physiologically and environmentally benign. Moreover, $CO_2$ requires no additional mixing, unlike other typical corrosion inhibitors.

Thus, while several embodiments have been shown and described, various changes and substitutions may of course be made, without departing from the spirit and scope of the invention. The invention, therefore, should not be limited, except by the following claims, and their equivalents.

What is claimed is:

1. A method for cleaning a semiconductor workpiece having one or more metal areas, comprising the steps of:
    placing the semiconductor workpiece into a processing chamber;
    spinning the semiconductor workpiece;
    introducing an aqueous liquid solution onto the semiconductor workpiece, with the metal areas subject to corrosion by the aqueous liquid solution generating ozone in an ozone gas generator;
    introducing the ozone gas into the processing chamber;
    introducing carbon dioxide gas into the processing chamber by injecting it downstream the ozone gas generator;
    with the ozone gas oxidizing contaminants on the semiconductor workpiece, and the carbon dioxide gas inhibiting corrosion of exposed metal areas by the aqueous liquid solution.

2. The method of claim 1 further comprising heating the aqueous liquid solution to 50-90° C.

3. The method of claim 1 wherein the ozone is entrained in the liquid solution before the liquid solution is introduced onto the workpiece.

4. The method of claim 1 wherein the liquid solution and the ozone gas are introduced separately into the processing chamber.

5. The method of claim 1 wherein the liquid solution is sprayed onto the workpiece.

6. The method of claim 1 wherein the carbon dioxide gas is dissolved in the liquid solution.

7. A method for cleaning a semiconductor wafer having one or more metal surfaces, comprising:
    placing the wafer into a chamber;
    rotating the wafer in the chamber;
    providing a liquid injected with carbon dioxide gas onto the wafer with the liquid forming a liquid layer on the wafer; separately and with the metal surfaces subject to corrosion by the liquid;
    providing ozone gas into the chamber with the ozone gas diffusing through the liquid layer and reacting with a contaminant on the wafer to clean the wafer; and
    with the carbon dioxide gas reducing corrosion of exposed metal surfaces by the liquid.

8. The method of claim 7 further comprising entraining the ozone gas in the liquid provided sprayed onto the wafer.

9. The method of claim 7 with the ozone gas provided into the chamber as a dry gas.

10. The method of claim 7 further comprising injecting the ozone gas into the liquid.

11. A method for cleaning a semiconductor wafer having one or more metal surfaces, comprising:
    placing the wafer into a chamber;
    rotating the wafer in the chamber;
    spraying a liquid including water injected with carbon dioxide gas onto the rotating wafer with the liquid forming a liquid layer on the rotating wafer, separately;
    providing ozone gas into the chamber from an ozone generator, with the ozone gas diffusing through the liquid layer and reacting with a contaminant on the wafer to clean the wafer; and
    with the carbon dioxide gas reducing corrosion of exposed metal surfaces by the liquid.

12. The method of claim 11 wherein the chamber has a carbon dioxide gas inlet and an ozone gas inlet separate from the carbon dioxide gas inlet, and wherein the carbon dioxide gas is provided into the chamber through the carbon dioxide gas inlet separately from the ozone gas.

13. The method of claim 11 wherein the ozone gas is separately provided into the chamber as a dry gas.

* * * * *

UNITED STATES PATENT AND TRADEMARK OFFICE
CERTIFICATE OF CORRECTION

PATENT NO.        : 7,264,680 B2  
APPLICATION NO. : 10/859668  
DATED              : September 4, 2007  
INVENTOR(S)      : Thomas Maximilian Gebhart et al.

It is certified that error appears in the above-identified patent and that said Letters Patent is hereby corrected as shown below:

Column 7, line 48, insert --;-- after "solution" and remove "generating";

Column 7, line 49, insert --generating-- before "ozone in an";

Column 7, line 52, insert --of-- between "downstream" and "the";

Column 8, lines 19-20, remove "separately and with the metal surfaces subject to corrosion by the liquid;"

Column 8, line 21, insert --separately-- before "providing";

Column 8, line 27, remove "sprayed";

Column 8, line 38, insert --;-- after "wafer" and remove "separately;";

Column 8, line 39, insert --separately-- before "providing".

Signed and Sealed this

Twenty-seventh Day of November, 2007

JON W. DUDAS  
*Director of the United States Patent and Trademark Office*